United States Patent [19]

Hills

[11] Patent Number: 5,036,430
[45] Date of Patent: Jul. 30, 1991

[54] INTEGRATED CIRCUIT CARD AND ELECTRONIC APPARATUS FOR USE THEREWITH

[75] Inventor: Robert G. Hills, Spencerport, N.Y.

[73] Assignee: Eastman Kodak Company, Rochester, N.Y.

[21] Appl. No.: 539,660

[22] Filed: Jun. 18, 1990

[51] Int. Cl.$^5$ .................. H05K 5/00; H01R 13/447; H01R 13/64; G06K 19/18

[52] U.S. Cl. .................. 361/399; 361/394; 361/395; 439/140; 439/677; 235/492

[58] Field of Search .............. 235/492, 495; 439/137, 439/140, 141, 633, 677, 680; 361/392, 394, 395, 399

[56] References Cited

FOREIGN PATENT DOCUMENTS 3200646 8/1982 Fed. Rep. of Germany ...... 361/394

Primary Examiner—Leo P. Picard
Assistant Examiner—Michael W. Phillips
Attorney, Agent, or Firm—David M. Woods

[57] ABSTRACT

An integrated circuit card including one or more integrated circuit elements interacts with a lever extending into a card-receiving receptacle in electronic apparatus for verifying correct insertion and opening a sliding shutter in the card. The integrated circuit elements are enclosed in a case having an opening for exposing a contact pattern that connects the integrated circuit elements to the electronic apparatus. The shutter is biased toward a closed position in which a forward surface covers the contact area. An inclined chamfer on a forward section of the case interacts with the lever to limit insertion to only one orientation of the case. By providing a tab on the rear of the shutter that extends from the case on the same side as the chamfer, the lever initially verifies correct insertion and subsequently engages the tab to drive the shutter to an open position exposing the contact pattern to the electronic apparatus.

15 Claims, 6 Drawing Sheets

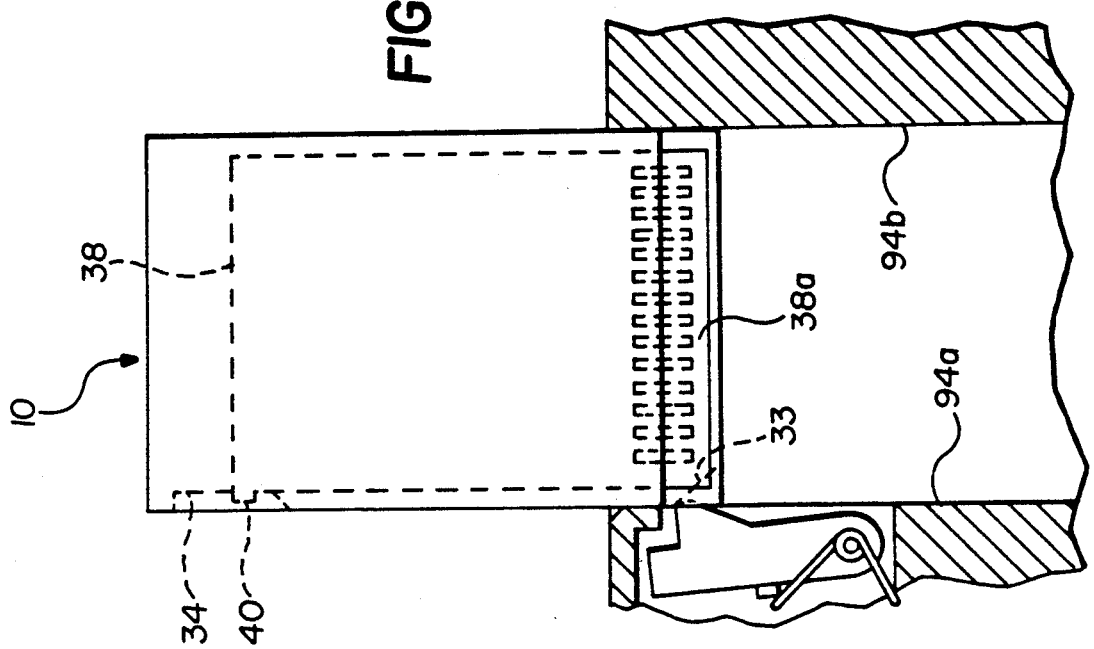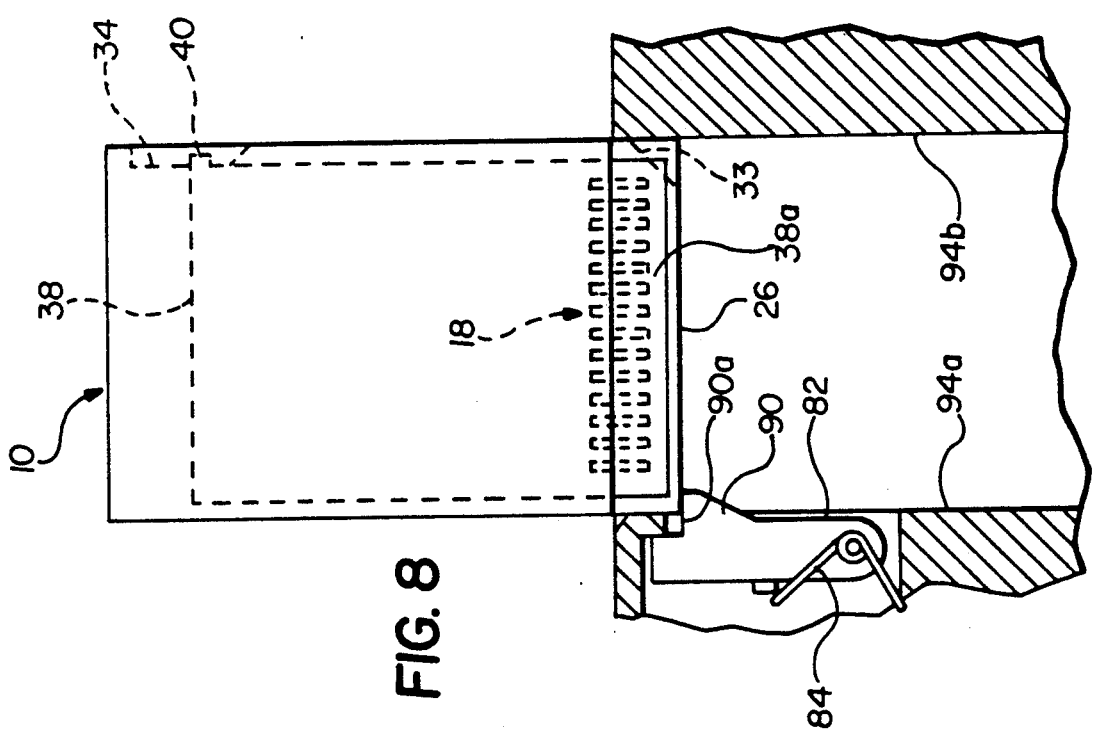

INTEGRATED CIRCUIT CARD AND ELECTRONIC APPARATUS FOR USE THEREWITH

BACKGROUND OF THE INVENTION

1. Field of the Invention

The present invention relates to a removable integrated circuit card that is inserted into electronic apparatus in order to connect with integrated circuit elements within the card.

2. Description Relative to the Prior Art

An integrated circuit card encloses one or more integrated circuit elements mounted on a substrate and connected to an electrical contact pattern toward one end of the card. A shutter is provided to cover and protect the contact pattern when the card is removed from an electrical connector in the electronic apparatus and to expose the contact pattern for electrical connection when the card is inserted into the connector. Moreover, it is desirable to provide a card configuration that prevents wrong-way insertion and consequential damage to the card and/or its contact pattern.

It is known to combine the operation of one-way insertion and shutter opening by means of one member located in the electrical connector that receives the card. For example, in U.S. Pat. No. 4,695,925 the connector includes a pair of opening pins that enter holes in a forward area of the card, thereby contacting the shutter and urging the shutter open. The pins (and the holes therewith) may be unsymmetrically positioned with respect to the card to prevent wrong-way insertion. In U.S. Pat. No. 4,780,793, shutter-opening ridges formed in the connector are keyed to grooves in the card to prevent a wrong-way insertion. However, in each case, the card must be fully, or almost fully, inserted before wrong-way insertion can be detected because the shutter opening pins or the grooves act upon the forward-most area of the card. This is a problem with respect to a typical situation because the user, upon encountering some reluctance toward the end of a card's travel, might be inclined to jam the card further into the apparatus. This is of particular concern since a wrong-way obstruction might easily be mistaken for the force that must be overcome in order to initiate travel of the shutter. It is consequently desirable to provide a wrong-way warning earlier in the card's travel so that there is no mistaking its meaning.

An early-warning provision is seen in U.S. Pat. No. 4,878,139 in connection with a loading apparatus for a floppy disk. The cartridge has an oblique edge at a forward corner which pushes a rearwardly-located slide pin out of the way when correctly inserted. When the cartridge is inserted on the wrong side, a square corner of the cartridge collides with the pin and prevents further advance. Shutter opening is handled by a separate mechanism. On the other hand, having the wrong-way detection mechanism also open the shutter (as in U.S. Pat. Nos. 4,695,925 and 4,780,793) helps to reduce parts and complexity. By separating the functions, that is, by enabling wrong-way detection well before shutter opening, completely separate members would appear to be necessary.

SUMMARY OF THE INVENTION

The invention stems from the recognition that by activating the shutter from the rear end thereof, rather than at its front surface, as is conventional, a single member in the card-receiving apparatus could perform the dual function of preventing wrong-way insertion and opening the shutter. To separate wrong-way detection from the opening function, however, it remains necessary that the functions be temporally separated as the card is inserted, that is, wrong-way detection has to come shortly after the card is inserted and well before shutter travel commences.

Consequently, according to the invention, an integrated circuit card is adapted for interaction with operative means extending into a card-receiving receptacle in electronic apparatus. The card includes enclosure means for substantially enclosing one or more integrated circuit elements. An opening in the enclosure means exposes a contact pattern for connecting the circuit elements to the electronic apparatus. A shutter is normally biased toward a closed position in which a forward surface thereof covers the contact pattern. Means, e.g., a tab, depending from the shutter rearwardly of its forward surface engages the operative means in the apparatus and together therewith drives the shutter to an open position exposing the contact pattern. In addition, the card has one-way insertion means, e.g., a chamfered corner, located forwardly of the shutter depending means, e.g., the shutter tab, to limit insertion to only one orientation of the enclosure means. By the forward location for wrong-way detection, the operative means in the electronic apparatus verifies a correct insertion before the shutter is driven to an open position.

BRIEF DESCRIPTION OF THE DRAWINGS

The invention will be described in relation to the drawings, in which:

FIG. 7 is a plan view of a correct insertion of the card into the receptacle;

FIG. 8 is a plan view of a wrong-way insertion of the card into the receptacle.

DETAILED DESCRIPTION OF THE INVENTION

Figure 1:
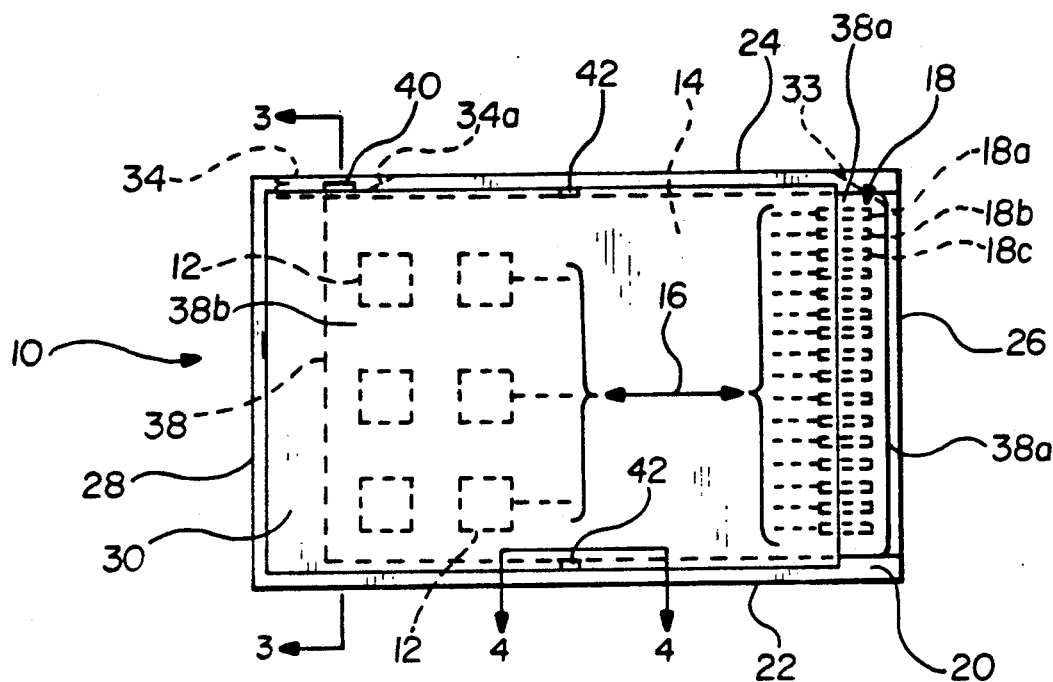
FIG. 1 is a plan view of an integrated circuit card having features provided by the invention.

Since integrated circuit cards are well known, the present description will be directed in particular to elements forming part of, or cooperating more directly with the present invention. Elements not specifically shown or described herein may be selected from those known in the art. For instance, the specific structure of the integrated circuit elements supported in the card is unimportant to a description of the invention and therefore such structure will not be described in detail. Likewise, although the card is intended for use with electronic apparatus, the specific details of such apparatus, except for the disclosed electrical connector aspects thereof, are unimportant to an understanding of the invention.

Referring now to FIGS. 1 through 4, an integrated circuit card 10 embodying the features of the invention is shown for storing and/or processing data in one or more integrated circuit elements 12. A substrate 14 (shown particularly in FIG. 3) supports the circuit elements 12 and provides electrical connection(s) 16 (FIG. 1) between the elements 12 and a contact area 18 on one end of the substrate 14. The contact area 18 is composed of a pattern of individually accessible contacts 18a, 18b, 18c, etc. formed on the surface of the substrate 14. A card frame 20 supports the substrate 14, and the circuit elements 12 therewith. The frame 20 includes parallel side walls 22 and 24, a front wall 26 on a forward section of the card 10, and a rear wall 28 on a rearward section of the card 10. (As used herein, "forward" refers to the end of the card 10 that first enters the connector.) The side walls 22 and 24 are stepped on the interiorly-facing sides thereof, as shown particularly in FIG. 3, in order to separately support the substrate 14 in relation to an upper cover 30 and a lower cover 32.

Figure 2:
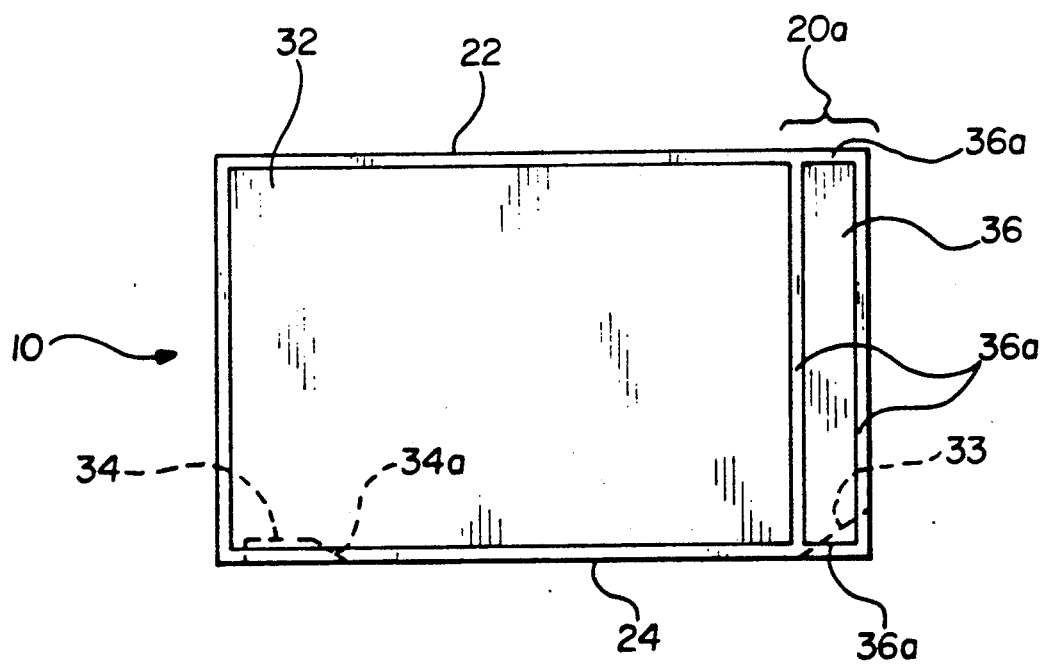
FIG. 2 is a plan view of the integrated circuit card of FIG. 1 as seen from the opposite side.

As appreciated from FIG. 1, the upper cover 30 is dimensioned to stop rearwardly of the front of the substrate 14, thus leaving an open portion for exposing the contact pattern 18 to the electronic apparatus. As shown in FIGS. 1 and 2, the frame 20 includes a recessed chamfer slot 33 having an inclined surface joining the side wall 24 and the front wall 26. An elongated opening recess 34 is located toward the rear wall 28 in the side wall 24. The recess 34 includes an inclined ramp 34a leading into the recess opening at the forward end thereof. The opposite side (FIG. 2) of the frame 20 has forward section 20a with a locking slot 36 formed therein. The locking slot 36 has a slightly depressed cross-section such that the floor of the slot is surrounded by slightly projecting walls 36a, particularly on the forward and rearward sides thereof.

Figure 3:
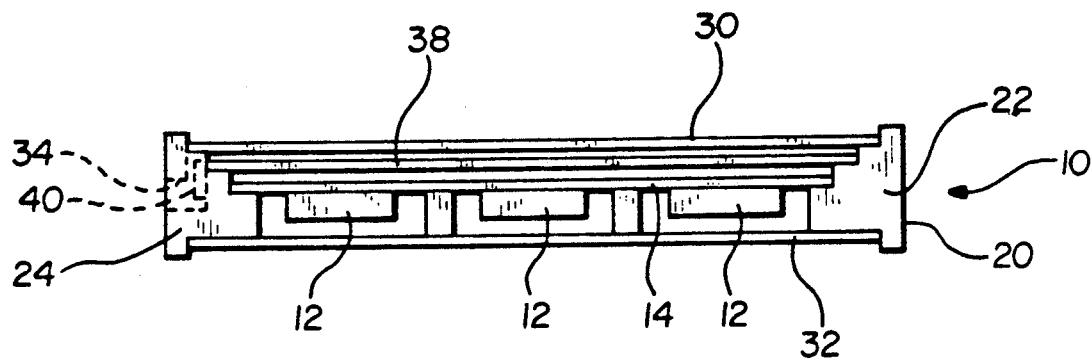
FIG. 3 is a side elevation of the integrated circuit card of FIG. 1 as taken along the lines 3—3 of FIG. 1.
Figure 4:
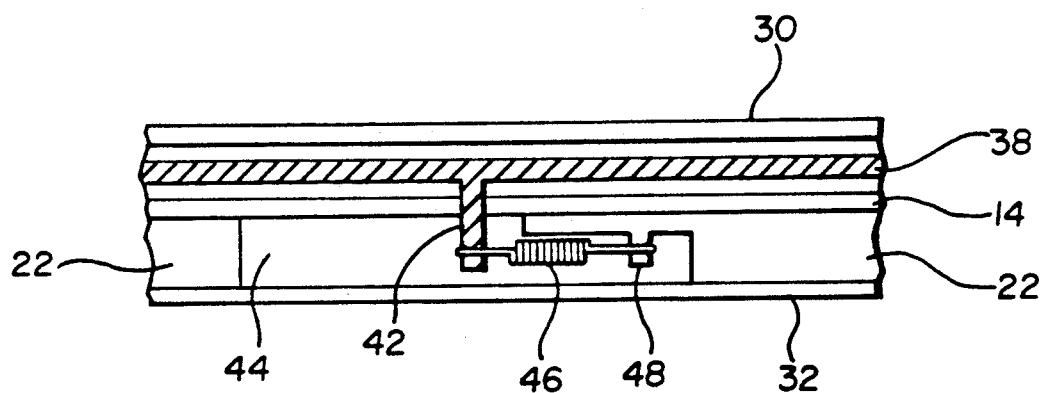
FIG. 4 is a detail elevation of the integrated circuit card of FIG. 1 as taken along the lines 4—4 of FIG. 1.

As best shown in FIGS. 1 and 3, a shutter 38 is supported in the frame 20 between the upper cover 30 and the substrate 14. The shutter has a forward surface 38a for covering the contact pattern 18 and a distal surface 38b extending adjacent the opening recess 34. A tab 40 extends from the distal surface 38b of the shutter into the opening recess 34. The opening recess 34 and the tab 40 therewith are situated along the lateral wall 24 rearwardly of the forward surface 38a of the shutter 38. Importantly, the opening recess 34 and the tab 40 are also situated rearwardly of the chamfer slot 33 on a common side 24 therewith. The shutter 38 has a lug 42 extending from each side thereof into respective cavities 44 (FIG. 4) in each side wall 22 and 24. As shown in FIG. 4, a spring 46 is attached between the lug 42 and a post 48 extending from the side wall 22 (or 24). The shutter 38 is thus supported for movement within the frame 20 such that the springs 46 tension the shutter 38 forwardly as shown in FIG. 1 toward a closed position in which the forward surface 38a covers the contact pattern 18 on the substrate 14.

Figure 5:
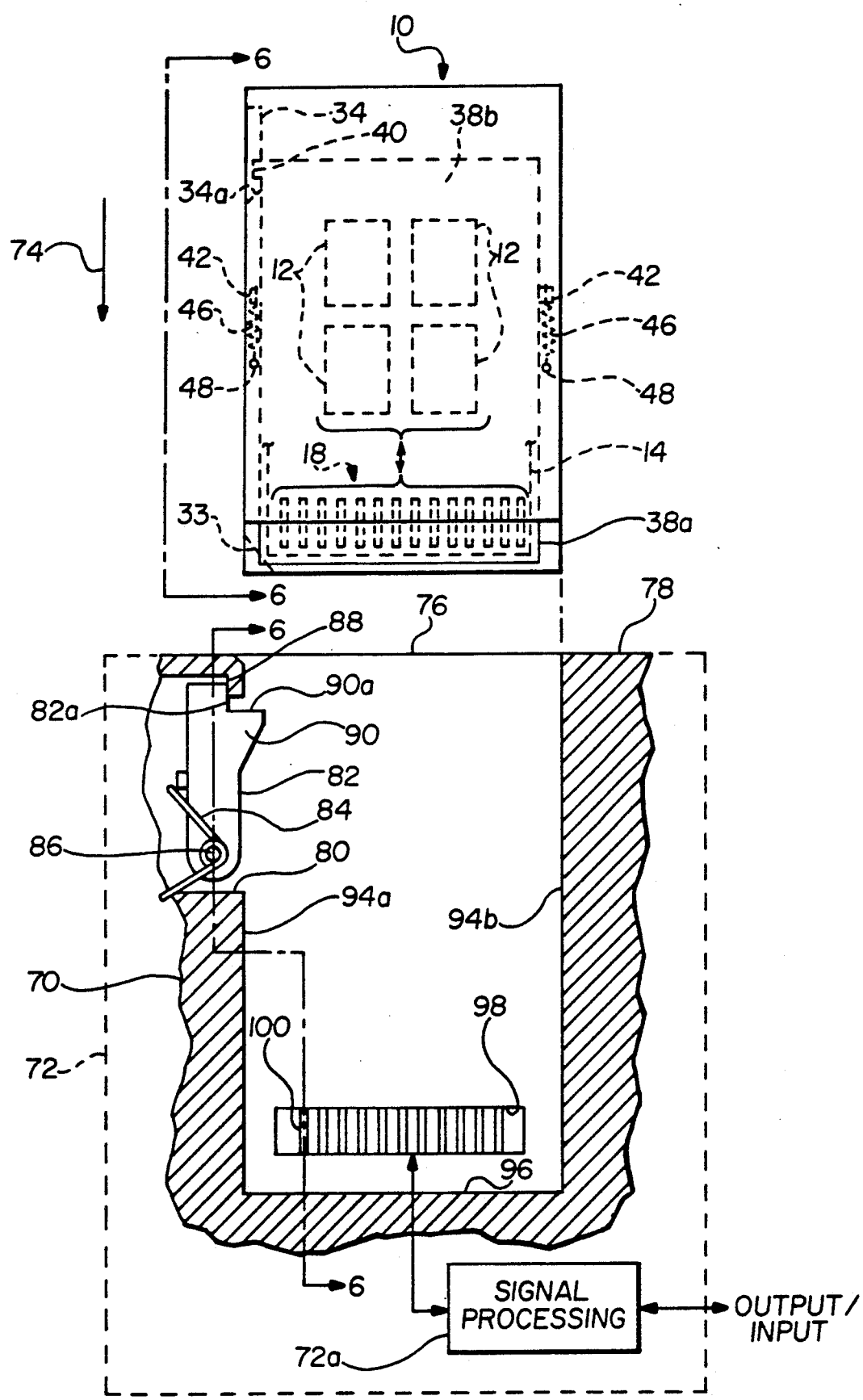
FIG. 5 is a plan view of the integrated circuit card and a card-receiving receptacle.
Figure 6:
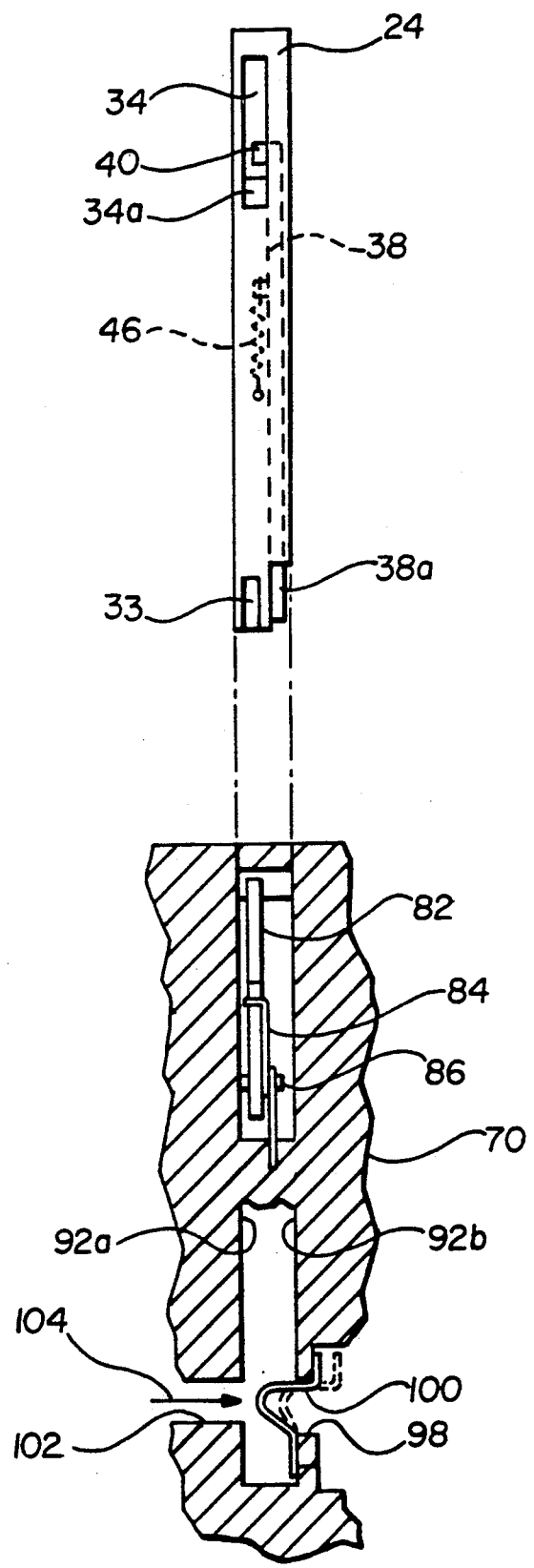
FIG. 6 is a side elevation of the integrated circuit card and receptacle taken generally along the line 6—6 of FIG. 5.

The card 10 is shown in FIGS. 5 and 6 in relation to a card-receiving receptacle 70 formed in electronic apparatus 72. (The electronic apparatus 72 is shown in broken line to include an exemplary electronic circuit, such as a signal processing circuit 72a. The particular processing function is, however, unimportant to an understanding of the invention.) The card 10 is adapted for manually directed movement as indicated by an arrow 74 (with its opposite side (FIG. 2) upward as shown in FIG. 5) through an access opening 76 in a side wall 78 of the electronic apparatus 72. The receptacle 70 includes a edge opening 80 containing a lever 82 that is tensioned by a spring 84 to pivot about an axis 86 into the receptacle 70. The spring 84 urges an upper extension 82a of the lever 82 against a ledge 88 such that an operative member 90 extending from the lever 82 protrudes into the receptacle 70 for engaging the card. (The operative member 90 is preferably a boss having a flat surface 90a directly opposed to the entering card 10). The receptacle 70 includes side walls 92a and 92b, and edge walls 94a and 94b, that serve to define an enclosed space and to guide the card 10 into the enclosed space of the receptacle.

The receptacle space is further defined by an end wall 96 situated opposite the access opening 76 in the side wall 78 of the electronic apparatus 72. An opening 98 in the side wall 92b situated toward the end wall 96 supports a plurality of electrodes 100 for engaging the contact area 18 of the card 10. The electrodes 100 are connected to the signal processing section 72a for transferring electrical information to and/or from the circuit elements 12 on the card 10. A further opening 102 is situated in the side wall 92a in generally opposed relation to the electrodes 100 such that a member (schematically shown by an arrow 104) may enter the receptacle 70 to secure the card 10 and force the contact pattern 18 of the card 10 against the electrodes 100.

In operation according to the invention, the card 10 is initially verified for a correct orientation when first inserted into the receptacle 70. This is shown in FIGS. 7 and 8 for correct and incorrect (wrong-way) insertion, respectively. If the card 10 is correctly inserted (FIG. 7), the recessed chamfer 33 encounters the operative member 90 and ramps the lever 82 counter-clockwise back into the opening 80. The way is then clear for the card 10 to be further inserted into the receptacle 70. If the card 10 is incorrectly inserted (FIG. 8), the front wall 26 of the card 10 collides with the flat surface 90a of the operative member 90 and further insertion is prevented. (Likewise, an inverted insertion of the card 10 brings the rear wall 28 against the operative member 90 and further insertion is prevented.) Accordingly, a wrong-way insertion is detected very early in the card's travel so there is no mistaking the reason for the blockage.

Figure 9:
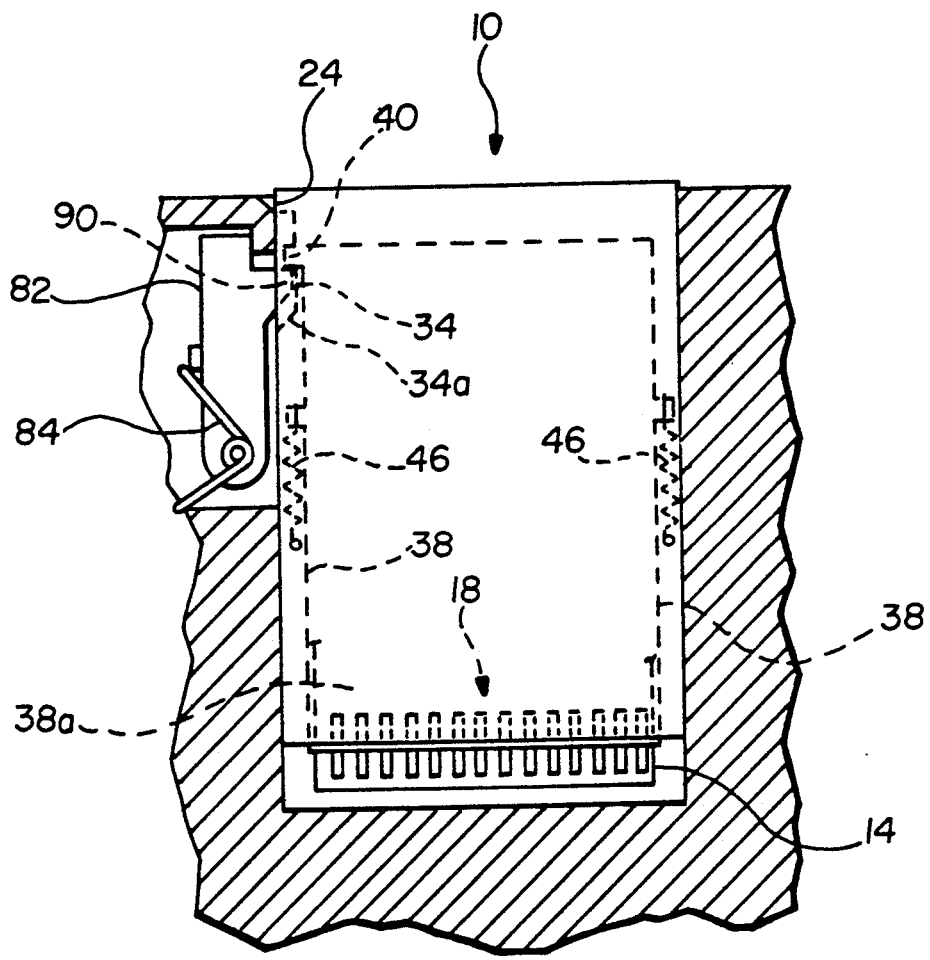
FIG. 9 is a plan view of a fully inserted card.

Now that correct insertion has been verified, the card 10 may be fully inserted into the receptacle 70, as shown in FIG. 9. Initially, as the card 10 is further inserted into the receptacle 72, the now-retracted operative member 90 slides along the side wall 24 of the card 10 until it reaches the opening recess 34. Thereafter, under tension from the spring 84, the member 90 slides along the ramp surface 34a and into the opening recess 34 and engages the tab 40 depending from the rear surface of the shutter 38. Further movement of the card 10 into the receptacle 70 urges the shutter 38 rearward against the tension of the springs 46 until the front surface 38a retreats sufficiently to expose the contact area 18.

At the same time, the card 10 slides across the opening 98 in the side wall 92b of the receptacle and the electrodes 100 make electrical contact with the contact area 18 on the card 10. (The electrodes 100 are omitted in FIG. 9 in order to keep the illustration clear.) In addition, the schematically-shown member 104 enters the locking slot 36 on the card 10 and secures the card 10 in the receptacle 70 (against the bias of the springs 46 in the card 10) with the contact pattern 18 firmly against the electrodes 100. (The precise form of the member 104, as well as the entire locking function, is unimportant to practice and understanding of the present invention). Electrical signals can then be transferred in a conventional manner between the circuit elements 12 on the card 10 and circuits in the electronic apparatus 72, such as the signal processing circuit 72a.

A principal benefit of an integrated circuit card as described herein is that a single member, the operative member 90, can be used to detect a correct insertion and to open the shutter. This tends to simplify the electronic apparatus 72 and minimize the number of parts. More importantly, one-way insertion can be temporally separated from the shutter opening, that is, correct insertion is detected (FIG. 7) well before the shutter is opened (FIG. 9). This is of significant importance in many applications, such as with consumer products, where the user of the equipment 72 may not exert due care or otherwise mistake the force associated with opening the shutter with the blockage exhibited by wrong-way insertion.

Manual removal of the card 10 is obtained by basically doing the reverse of the preceding operation. Initially, the schematically-shown locking member 104 is withdrawn from the locking slot 36 and the card 10 begins to eject under urging of the springs 46 against the operative member 90. The rear end of the card 10 is then pulled outward by the user. The lever 82 pivots counter clockwise as the inclined ramp 34a of the opening recess 36 ramps the operative member 90 away from the card 10. At the same time, the springs 46 urge the shutter 38 to its closed position where the forward surface 38a overlies and protects the contact area 18. As the card 10 is fully removed from the receptacle 70, the lever 82 pivots clockwise until the upper area thereof meets the ledge 88 and the card-engaging operative member 90 is thrust into the enclosed space of the receptacle opening.

The invention has been described in detail with particular reference to a presently preferred embodiment, but it will be understood that variations and modifications can be effected within the spirit and scope of the invention.

What is claimed is:

1. An integrated circuit card adapted for insertion into a receptacle in electronic apparatus, said apparatus having operative means extending into the receptacle for engaging the card, said card comprising:
    circuit means including one or more integrated circuit elements and a contact pattern for connecting the circuit elements to the electronic apparatus;
    enclosure means for substantially enclosing said circuit means, said enclosure means including an open portion for exposing said contact pattern to an electronic apparatus, said open portion of said enclosure means included in a forward section thereof that first enters a receptacle during a correct insertion;
    a shutter supported by said enclosure means for movement relative to said circuit means, said shutter being normally biased toward a closed position in which a forward surface thereof covers said contact pattern;
    means depending from said shutter rearwardly of said forward surface for engaging an operative means and together therewith driving said shutter toward an open position exposing said contact pattern through said open portion to an electronic apparatus; and
    one-way insertion means located on said enclosure means forwardly of said shutter depending means for interacting with an operative means to limit insertion to only one orientation of said card, whereby the interaction of the one-way insertion means and an operative means verifies a correct one-way insertion before interaction with the shutter depending means drives the shutter toward an open position.

2. A card as claimed in claim 1 in which said one-way insertion means is located in said forward section of said enclosure means.

3. A card as claimed in claim 2 in which said enclosure means includes a recessed opening for exposing said shutter depending means to an operative means extending into a receptacle.

4. A card as claimed in claim 3 wherein said one-way insertion means and said recessed opening are disposed relative to each other on a common edge of said enclosure means whereby an operative means encounters said one-way insertion means before encountering said recessed opening as said cards is inserted into a receptacle.

5. A card as claimed in claim 4 wherein said shutter depending means is a tab extending from said shutter and said operative means includes a retractable lever that extends into a receptacle so as to engage said tab as said recessed opening passes adjacent said operative means.

6. A card as claimed in claim 5 wherein said one-way insertion means is an inclined surface that ramps said retractable lever out of a receptacle as the card enters a receptacle in a correct orientation.

7. A integrated circuit card adapted for insertion into a receptacle in electronic apparatus, said apparatus having an operative member extending into the receptacle for detecting a correct-way card insertion, said card comprising:
    a substrate including one or more memory elements;
    a contact pattern provided on said substrate for connecting the memory elements to the electronic apparatus;
    a card-shaped case enclosing said substrate and having an access opening in a surface thereof at a position overlying said contact pattern, said card having lateral edges that are so oriented as to guide the card into the space enclosed by said receptacle in said electronic apparatus;
    one-way insertion means included on a lateral edge of said case for limiting insertion thereof into said enclosed space to only one orientation of said case, said one-way insertion means included in a forward section of said case that first enters the receptacle during a correct insertion;
    an opening recess disposed rearwardly from said one-way insertion means on said same lateral edge;
    a shutter for opening and closing said opening, said shutter having a front surface for covering said contact pattern and a rear surface extending adjacent said opening recess;
    means for biasing said shutter forward toward a closed position such that said contact pattern is covered; and
    means depending from said shutter toward said rear surface thereof and extending into said opening recess for engaging said operative member in the electronic apparatus and cooperating therewith to drive said shutter to an open position exposing said contact pattern to said electronic apparatus.

8. A card as claimed in claim 7 in which said operative member extending into said receptacle is disposed to retract out of the space enclosed by said receptacle and wherein said one-way insertion means is a chamfered corner connecting said same lateral edge and a forward edge of said case, said chamfered corner ramping said operative member out of said enclosed space when said card is correctly inserted.

9. A memory card as claimed in claim 8 in which said operative member is pretensioned to extend into said enclosed space, and wherein, during continued insertion of said card, said operative member is disposed to enter said opening recess and engage said means depending from said shutter.

10. A memory card as claimed in claim 9 wherein said biasing means includes at least one spring connected between said shutter and said case.

11. Electronic apparatus having a signal processing circuit and electrode terminals connected therewith for transferring information between the signal processing circuit and a removable integrated circuit card, said card including one or more memory elements and a contact pattern connected to the memory elements, one-way insertion means located on a forward section of said card for limiting insertion to only one orientation of the card, a shutter supported for movement relative to said contact pattern, said shutter being normally biased toward a closed position in which a forward surface thereof covers said contact pattern, and means depending from said shutter rearwardly of said forward surface for engaging the apparatus and driving said shutter toward an open position exposing said contact area to the electronic apparatus, said electronic apparatus comprising:

a receptacle having an opening for receiving the card into an enclosed space defined by substantially parallel edge walls that guide said card into said receptacle; and operative means extending into said enclosed space from one of the edge walls for engaging said one-way insertion means and said means depending from said shutter in sequential order thereof, whereby the interaction of said operative means and said one-way insertion means verifies a correct on-way insertion before said operative means engages said depending means and together therewith drives the shutter toward an open position.

12. Apparatus as claimed in claim 11 wherein said operative means includes a pretensioned lever that is biased into said enclosed space.

13. Apparatus as claimed in claim 12 wherein said one-way insertion means includes an inclined surface on a forward corner of said card for initially camming said lever out of said enclosed space if said card is correctly inserted.

14. Apparatus as claimed in claim 13 wherein said means depending from said shutter is located in an opening recess disposed on said card rearwardly of said one-way insertion means, and wherein said opening recess permits said lever to re-enter said enclosed space and engage said means depending from said shutter.

15. Apparatus as claimed in claim 14 wherein said lever has a boss that engages said depending means and drives said shutter toward said open position.

* * * * *